United States Patent
Mitros et al.

(10) Patent No.: US 6,958,269 B2
(45) Date of Patent: Oct. 25, 2005

(54) MEMORY DEVICE WITH REDUCED CELL SIZE

(75) Inventors: Josef Czeslaw Mitros, Richardson, TX (US); Imran Khan, Richardson, TX (US); Lily Springer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/178,100

(22) Filed: Jun. 24, 2002

(65) Prior Publication Data

US 2003/0235949 A1 Dec. 25, 2003

(51) Int. Cl.[7] ..................... H01L 21/236; H01L 29/745
(52) U.S. Cl. ...................... 438/257; 438/258; 438/260; 438/261; 438/593; 438/588; 438/264; 257/213; 257/314; 257/315; 257/319; 257/410
(58) Field of Search ................................ 438/257, 262, 438/263, 264, 594, 258–261, 265–267, 593, 438/588; 257/213, 214, 315, 322, 410, 317, 257/321, 320, 319

(56) References Cited

U.S. PATENT DOCUMENTS

| | | | | |
|---|---|---|---|---|
| 5,033,023 A | * | 7/1991 | Hsia et al. | 365/185.12 |
| 5,140,551 A | * | 8/1992 | Chiu | 365/185.08 |
| 5,567,635 A | * | 10/1996 | Acovic et al. | 438/259 |
| 5,619,051 A | * | 4/1997 | Endo | 257/316 |
| 6,084,798 A | * | 7/2000 | Lee | 365/185.03 |
| 6,211,548 B1 | * | 4/2001 | Ma | 257/321 |
| 6,288,419 B1 | * | 9/2001 | Prall et al. | 257/213 |
| 6,426,896 B1 | * | 7/2002 | Chen | 365/185.26 |
| 6,489,200 B1 | * | 12/2002 | Leu et al. | 438/257 |
| 6,754,108 B2 | * | 6/2004 | Forbes | 365/185.25 |

* cited by examiner

*Primary Examiner*—B. William Baumeister
*Assistant Examiner*—Igwe U. Anya
(74) *Attorney, Agent, or Firm*—Rose Alyssa Keagy; W. James Brady, III; Frederick J. Telecky, Jr.

(57) ABSTRACT

A method for manufacturing a memory device includes forming an oxide layer adjacent a substrate. A floating gate layer is formed and disposed outwardly from the oxide layer. A dielectric layer is formed, such that it is disposed outwardly from the floating gate layer. Then, a conductive material layer is formed and disposed outwardly from the dielectric layer, wherein the conductive material layer forms a control gate that is substantially isolated from the floating gate layer by the dielectric layer.

18 Claims, 3 Drawing Sheets

MEMORY DEVICE WITH REDUCED CELL SIZE

TECHNICAL FIELD OF THE INVENTION

This invention relates generally to non-volatile memory devices and, more specifically, to memory devices with reduced cell size.

BACKGROUND OF THE INVENTION

Non-volatile memory is used to store data in a device where the data has to be maintained even when the device is not connected to a power supply. For example, non-volatile memory may be used in personal computers to store instructions for completing basic tasks, such as a BIOS interfacing with a keyboard or accessing a disk drive. A common type of non-volatile memory is an EEPROM (electrically erasable programmable read-only memory). Unlike some other types of non-volatile memory devices, data in EEPROM devices can be erased and rewritten.

Currently, single poly EEPROM devices generally require a large cell area. This limits their applications to a few tens of cells per die. The large cell area might be caused by using both a control gate and an erase gate. The high voltages used for programming and erasure generally necessitate that the nwell/nmoat overlap and that the nwell/nmoat space are relatively large. This makes overall EEPROM cells large (in many instances, 200 $\mu m^2$ to 500 $\mu m^2$ per cell).

SUMMARY OF THE INVENTION

One aspect of the invention is a method for manufacturing a memory device that includes forming an oxide layer adjacent a substrate. A floating gate layer is formed and disposed outwardly from the oxide layer. A dielectric layer is formed, such that it is disposed outwardly from the floating gate layer. Then, a conductive material layer is formed and disposed outwardly from the dielectric layer, wherein the conductive material layer forms a control gate that is substantially isolated from the floating gate layer by the dielectric layer.

The invention has several important technical advantages. Various embodiments of the invention may have none, some or all of these advantages. One advantage may be that substantially isolating the conductive control gate layer from the floating gate layer, using the dielectric layer, forms a structure which can be used to build an analog capacitor. That allows positive or negative voltage to be applied to the control gate. This allows the memory device to be programmed and erased using the same control gate, eliminating the need for an erase gate. This may decrease the EEPROM cell area by about 90% compared to the prior art single poly EEPROM cell area.

The present invention may further have the advantage of lower die cost as a result of the reduced cell area and/or reduced process complexity and number of masks required to manufacture the integrated circuit with nonvolatile memory. Additional advantages may include higher density EEPROM—with perhaps 64 kilobytes more memory capacity—than existing single poly EEPROM and reduced fabrication process complexity. Other technical advantages of the present invention will be readily apparent to one skilled in the art.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF EXAMPLE EMBODIMENTS OF THE INVENTION

Figure 1:
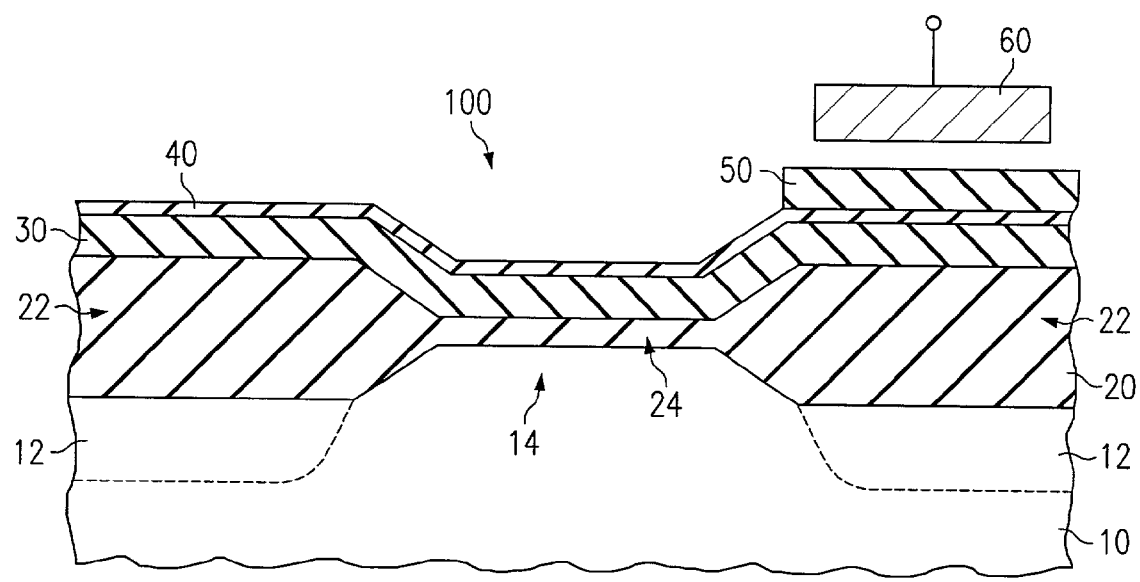
FIG. 1 is a cross-sectional view illustrating a portion of an embodiment of a memory device constructed in accordance with the present invention.

FIG. 1 illustrates a cross-sectional view of a memory device 100 manufactured in accordance with the present invention. Memory device 100 may comprise an EEPROM (electrically erasable programmable read-only memory). Particular examples and dimensions specified throughout this document are intended for exemplary purposes only and are not intended to limit the scope of the invention. Other embodiments of memory device 100 may be formed without departing from the scope of this disclosure.

In one embodiment, memory device 100 includes substrate 10, oxide layer 20, floating gate layer 30, silicide layer 40, dielectric layer 50, and conductive material layer 60. Memory device 100 may also include a Pwell region 14 and may include a Nwell region 12 in substrate 10 beneath the control gate. One purpose of Nwell region 12 is to reduce capacitance of floating gate to Pwell and p-substrate to increase the coupling ratio between the control gate and the floating gate. It will be understood that while memory device 100 is described in terms of an n-channel device, a p-channel device may be formed without departing from the scope of the invention. Further, memory device 100 may include a sense transistor 110 (shown in FIG. 2) that includes a source region, a drain region, and a channel region.

Substrate 10 may be a wafer formed from a single crystalline silicon material. Substrate 10 may also comprise other materials. For example, substrate 10 may comprise an epitaxial material, a polycrystalline semiconductor material, or any other suitable material. Substrate 10 may also comprise multiple layers of semiconductor material without departing from the scope of the invention. The substrate 10 is doped with sufficient p-type ions, such as boron, to form Pwell region 14. A combination of arsenic and phosphorous ions may be implanted into the substrate 10 to form Nwell region 12.

Oxide layer 20 is formed adjacent to substrate 10 by any of a variety of techniques known to those skilled in the art. It will be understood that oxide layer 20 may include a field oxide region 22 and gate oxide region 24. In one embodiment, gate oxide layer 24 is formed from a single oxide material and is approximately seventy-five to one hundred twenty Angstroms thick. The field oxide layer 22 may be formed by thermal oxidation of silicon to the final field oxide thickness 3,000 to 8,000 Angstrom. While desirable results may be obtained with this thickness range, the invention is not limited to any particular thickness unless expressly included in the claims. Other embodiments of the present invention may exclude oxide layer 20, comprise other materials, or include a plurality of layers comprising or in place of oxide layer 20 without departing from the scope of the present invention.

Floating gate layer 30 is disposed outwardly from oxide layer 20 and may be formed from a polycrystalline silicon material (polysilicon) that is doped by implantation, doped by POCl3 in a furnace, or in-situ doped with impurities to render the polysilicon conductive. In one embodiment, memory device 100 may include silicide layer 40. Silicide layer 40 may be formed from any one of a variety of silicon-based materials, such as cobalt silicide (CoSi2), platinum silicide (PtSi2), and titanium silicide (TiSi2).

Memory device 100 includes a dielectric layer 50. Dielectric layer 50 may be formed from any one of a variety of insulating materials, including oxide or oxide-nitride-oxide (ONO), such that it substantially isolates conductive material layer 60 from floating gate layer 30 to form a control gate. As will be understood by those skilled in the art, the control gate, made of conductive material layer 60, is capacitively coupled with the floating gate layer 30—being well isolated from it by an insulating—or dielectric—layer 50. The same floating gate layer 30, dielectric layer 50, and conductive material layer 60 could be used to build an analog capacitor in the same integrated circuit that significantly reduces its manufacturing cost. The dielectric layer 50 may comprise other materials or may comprise a plurality of layers without departing from the scope of the present invention. Dielectric layer 50 is approximately two hundred fifty to five hundred Angstroms thick. While desirable results may be obtained with this thickness range, the invention is not limited to any particular thickness unless expressly included in the claims.

The conductive material layer 60 may be formed from any one of a variety of conducting materials, including metals or metal alloys, such as copper (Cu), aluminum (Al), tungsten (W), titanium tungsten (TiW), and titanium nitride (TiN), or highly doped polysilicon. The conductive material layer 60 forms a control gate that is substantially isolated from other components and the silicon substrate. As a result, the control gate is operable to receive positive and negative voltage and the memory device 100 may be programmed and erased by applying these voltages to the control gate. In one embodiment, the capacitance of the control gate may not change as a function of voltage.

In one aspect of operation, the presence or absence of charge on the floating gate layer 30 associated with device 100 determines the threshold voltage of the device, and drain read current Idread which flows through the device when specific drain Vd and control gate Ccg voltages are applied. For example, a positive voltage of fourteen to twenty-four volts is applied to the conductive material layer 60 to program memory device 100 operating in a first mode. This causes the attraction of charge to floating gate layer 30 as the electrons flow through gate oxide 24 and will charge the floating gate layer 30, increasing the threshold voltage of the memory device 100 to or above 5V. As a result the drain read current Idread(Vds=1V,Vcg=5V) is negligible, i.e., at single microamperes level or below it. The floating gate layer 30 has negative charge in such programmed state. Due to the substantial isolation of the conductive material layer 60, this device does not require an erase gate 120 (shown in FIG. 2). To erase the memory device 100 operating in a second mode, negative fourteen to twenty-four volts is applied to the control gate 60. The negative voltage causes the electrons to flow away from the floating gate layer 30 to the substrate. This makes its floating layer gate 30 neutral or charged by positive charge. The threshold voltage of erased device is equal that of UV erased device or is below it. The drain read current Idread(Vds=1V,Vcg=5V) is well above ten microamperes.

Figure 2:
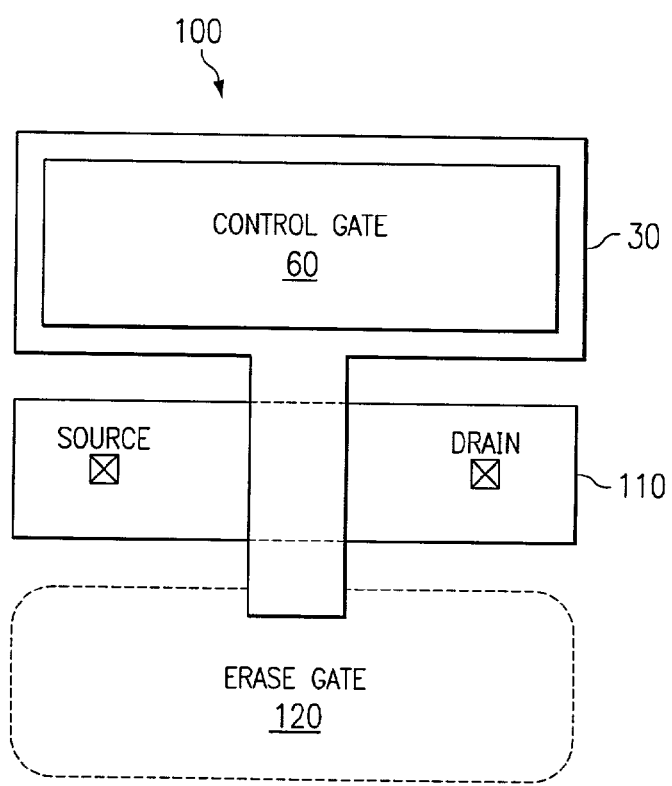
FIG. 2 is an overhead view illustrating the memory device of FIG. 1.

FIG. 2 is an overhead view illustrating one embodiment of memory device 100. In this embodiment, memory device 100 includes sense transistor 110, floating gate layer 30, and conductive material layer 60. Further illustrated in FIG. 2 is the erase gate 120, which is not required in the present invention. It will be understood that while erase gate 120 is not required, it may be present without departing from the scope of this disclosure.

If memory device 100 includes erase gate 120, then memory device 100 is programmed when the erase gate 120 is grounded and a positive voltage of fourteen to twenty-four volts is applied to the conductive material layer 60. The floating gate layer 30 will be charged negatively. To erase, the conductive material layer 60 is grounded and a positive voltage of twelve to twenty volts is applied to the erase gate 120. The electrons flow away from the floating gate layer 30 and the floating layer gate 30 is neutral or charge positively. By forming memory device 100 such that control gate 60 may be used to both program and erase the EEPROM, the present invention eliminates the need for erase gate 120. In this regard, memory device 100 may reduce its cell size by 90%.

FIGS. 3a through 3f are cross-sectional views illustrating one embodiment of a method of forming memory device 100. Any other suitable memory device may use the method illustrated by FIGS. 3a–3f to form a memory device 100 without departing from the scope of this disclosure. Referring now to FIG. 3, memory device 100 includes substrate 10 with Pwell region 14 and Nwell region 12.

Figure 3A:
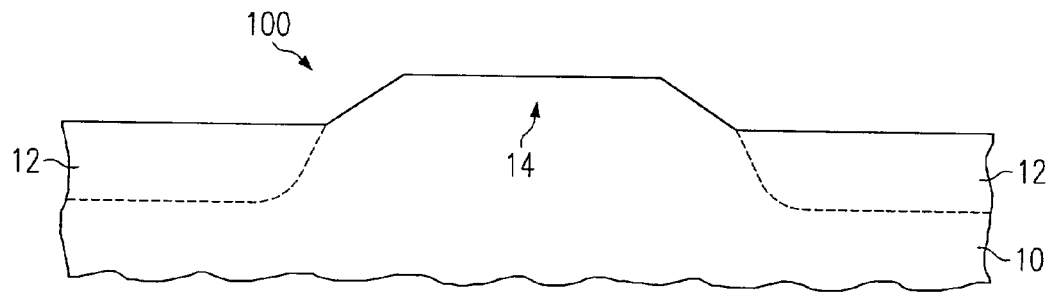
FIGS. 3a–f are cross-sectional views illustrating an example method of forming the memory device of FIG. 1.
Figure 3B:
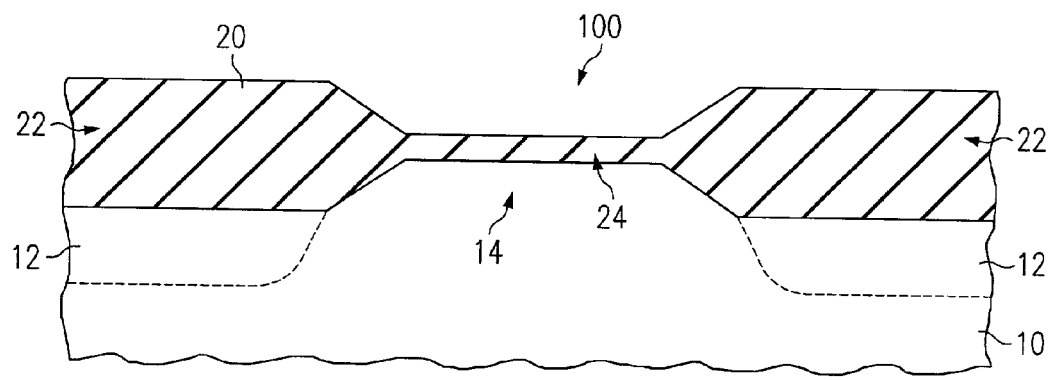

In FIG. 3b, an oxide layer 20 is disposed outwardly from the substrate 10. In this embodiment, the oxide layer includes gate oxide 22 and field oxide 24. Oxide layer 20 may be formed by any of a variety of techniques known to those skilled in the art including thermal oxidation, CVD (chemical vapor deposition), RTO (Rapid Thermal Oxidation), RPO (Remote Plasma Oxidation), and RT-CVD (Rapid Thermal CVD). In one embodiment, gate oxide layer 22 is formed from a single oxide material and is approximately seventy-five to one hundred twenty Angstroms thick. The field oxide layer 22 may be formed by thermal oxidation of silicon to the final field oxide thickness 3,000 to 8,000 Angstrom. While desirable results may be obtained with this thickness range, the invention is not limited to any particular thickness.

Figure 3C:
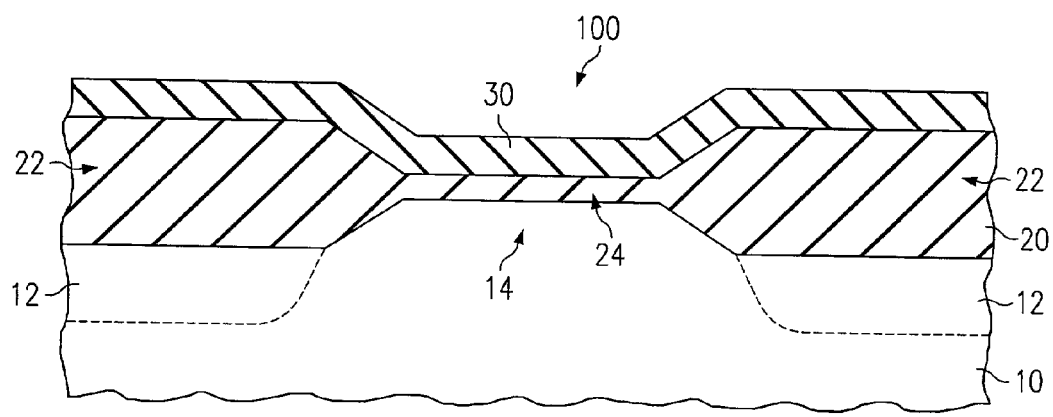
Figure 3D:
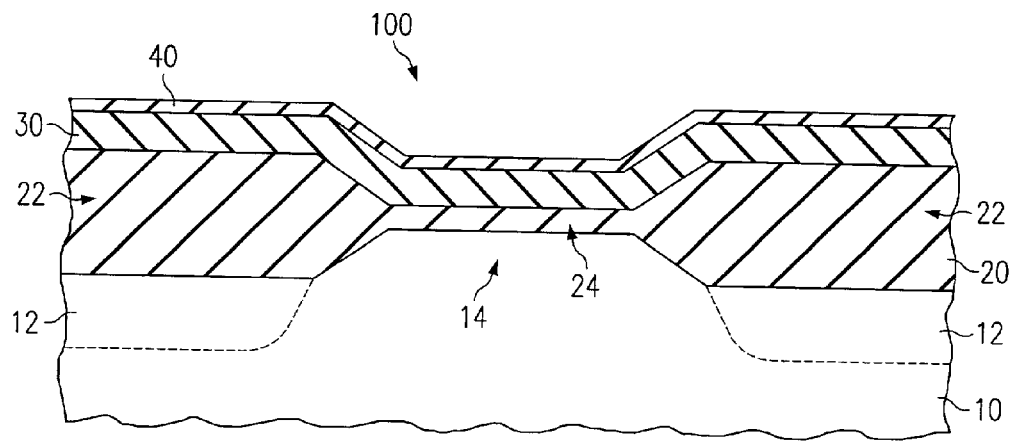

In FIG. 3c, a floating gate layer 30 is disposed outwardly from the oxide layer 20. It will be understood that floating gate layer 30 may be formed by any technique, such as chemical vapor deposition (CVD), and may comprise any polysilicon or another conductive material. In FIG. 3d, a silicide layer 40 is disposed outwardly from the floating gate layer 40. It will be understood that silicide layer 40 may be formed by any of a variety of techniques known to those skilled in the art including sputtering, CVD (Chemical Vapor Deposition), and RT-CVD (Rapid Thermal CVD), RTA (Rapid Thermal Anneal), and furnace anneal.

Figure 3E:
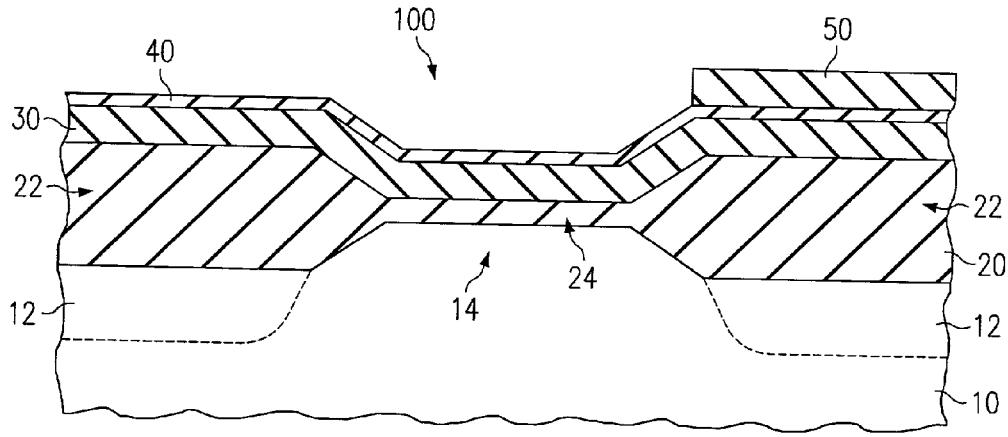

In FIG. 3e, a dielectric layer 50 is disposed outwardly from the silicide layer 40. Dielectric layer 50 may be formed from any one of a variety of dielectric materials, including oxide or oxide-nitride-oxide (ONO), such that it substantially isolates conductive material layer 60 from floating gate layer 30. Floating gate layer 30, silicide layer 40, dielectric layer 50, and conductive material layer 60 may form an analog capacitor in another part of the same integrated circuit. In this embodiment, the dielectric layer 50 is between two hundred fifty to five hundred Angstroms thick. While desirable results may be obtained with this thickness range, the invention is not limited to any particular thickness unless expressly included in the claims. Dielectric layer 50 may comprise a plurality of layers without departing from the scope of the present invention. Dielectric layer 50 may be formed by any of a variety of techniques known to those skilled in the art, including CVD (Chemical Vapor Deposition), RTA (Rapid Thermal Anneal), RTO (Rapid Thermal Oxidation), RPO (Remote Plasma Oxidation), RT-CVD (Rapid Thermal CVD), and thermal oxidation.

Figure 3F:
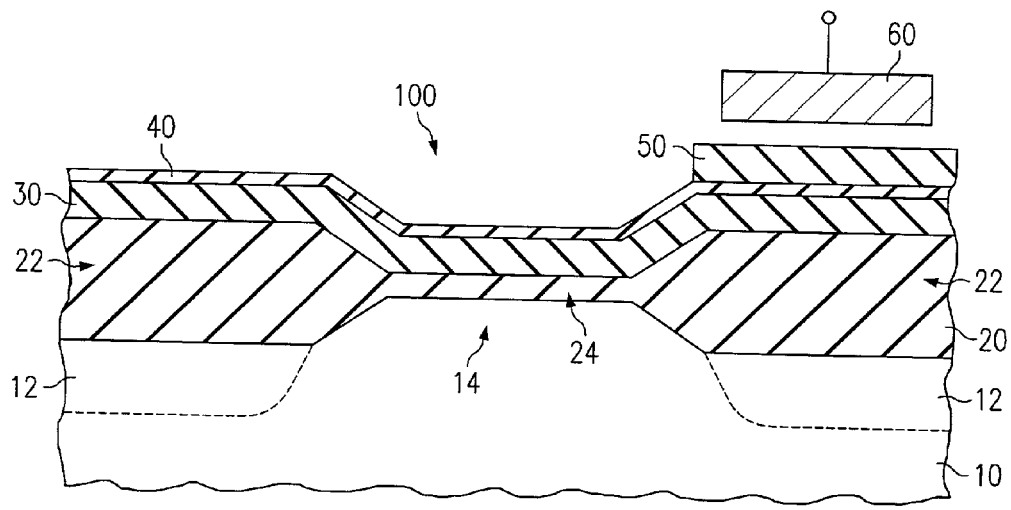

In FIG. 3f, a conductive material layer 60 is disposed outwardly from the dielectric layer 50. It will be understood that the conductive material layer 60 is substantially isolated from the floating gate layer 30 by the dielectric layer 50. The conductive material layer 60 forms a control gate that is operable to act as an analog capacitor, in conjunction with dielectric layer 50 and floating gate layer 30. The conductive material layer 60 may be formed by CVD (Chemical Vapor Deposition), PVD (Physical Vapor Deposition), PECVD/PEPVD (Plasma Enhanced CVD/Plasma Enhanced PVD), and sputtering, in eventual combination with annealing processes.

Although the present invention has been described in detail, it should be understood that various changes, substitutions and alterations can be made hereto without departing from the sphere and scope of the invention as defined by the appended claims.

To aid the Patent Office, and any readers of any patent issued on this application in interpreting the claims appended hereto, applicants wish to note that they do not intend any of the appended claims to invoke 35 U.S.C. §112, ¶6 as it exists on the date of filing hereof unless "means for" or "step for" are used in the particular claim.

What is claimed is:

1. A method for manufacturing a memory device, comprising:
   forming an oxide layer adjacent a substrate;
   forming a floating gate disposed outwardly from the oxide layer;
   forming a dielectric layer disposed outwardly from the floating gate, the gate dielectric layer having no ferroelectric material; and
   forming an area of conductive metal material disposed outwardly from the dielectric layer, the area of conductive metal material forming a control gate that is substantially isolated from the floating gate by the dielectric layer, wherein the control gate is smaller than the floating gate, the control gate is operable to program the memory device while operating in a first mode, and the control gate is operable to erase the memory device while operating in a second mode.

2. The method of claim 1, wherein the floating gate comprises polysilicon.

3. The method of claim 1, wherein the area of conductive metal material is selected from the group consisting of:
   titanium silicide;
   tungsten silicide;
   platinum silicide;
   titanium tungsten;
   titanium nitride;
   aluminum;
   copper; and
   tungsten.

4. The method of claim 1, wherein the memory device comprises an EEPROM memory device.

5. The method of claim 1, further comprising forming a silicide layer disposed outwardly from the floating gate and disposed inwardly from the dielectric layer.

6. The method of claim 1, wherein:
   the dielectric layer comprises an outer oxide layer and the thickness of the outer oxide layer is between 250 and 500 angstroms; and
   the control gate, the floating gate, and the dielectric layer form an analog capacitor.

7. The method of claim 6, wherein the capacitance of the control gate does not change as a function of voltage.

8. The method of claim 1, wherein the control gate is further operable to:
   receive a positive voltage while operating in the first mode; and
   receive a negative voltage while operating in the second mode.

9. The method of claim 8, wherein:
   the positive voltage causes the attraction of negative charge to the floating gate; and
   the negative voltage causes the removal of electrons from the floating gate.

10. A memory device, comprising:
    an oxide layer adjacent a substrate;
    a floating gate disposed outwardly from the oxide layer;
    a dielectric layer disposed outwardly from the floating gate, the gate dielectric layer having no ferroelectric material; and
    conductive metal material disposed outwardly from the dielectric layer, the conductive metal material forming a control gate that is substantially isolated from the floating gate by the dielectric layer, wherein the control gate is smaller than the floating gate, the control gate is operable to program the memory device while operating in a first mode, and the control gate is operable to erase the memory device while operating in a second mode.

11. The memory device of claim 10, wherein the floating gate comprises polysilicon.

12. The memory device of claim 10, wherein the conductive metal material is selected from the group consisting of:
    titanium suicide;
    tungsten suicide;
    platinum suicide;
    titanium tungsten;
    titanium nitride;
    aluminum;
    copper; and
    tungsten.

13. The memory device of claim 10, wherein the memory device comprises an EEPROM memory device.

14. The memory device of claim 10, further comprising a silicide layer disposed outwardly from the floating gate and disposed inwardly from the dielectric layer.

15. The memory device of claim 10, wherein:
    the dielectric layer comprises an outer oxide layer and the thickness of the outer oxide layer is between 250 and 500 angstroms; and
    the control gate, the floating gate, and the dielectric layer form an analog capacitor.

16. The memory device of claim 15, wherein the capacitance of the control gate does not change as a function of voltage.

17. The memory device of claim 10, wherein the control gate is further operable to:
    receive a positive voltage while operating in the first mode; and
    receive a negative voltage while operating in the second mode.

18. The memory device of claim 17, wherein:
    the positive voltage causes the attraction of negative charge to the floating gate; and
    the negative voltage causes the removal of electrons from the floating gate.

* * * * *